(12) United States Patent
Torregrosa et al.

(10) Patent No.: US 8,895,945 B2
(45) Date of Patent: Nov. 25, 2014

(54) DOSE MEASUREMENT DEVICE FOR PLASMA-IMMERSION ION IMPLANTATION

(75) Inventors: Frank Torregrosa, Simiane (FR); Laurent Roux, Marseilles (FR)

(73) Assignee: Ion Beam Services, Peynier (FR)

( * ) Notice: Subject to any disclaimer, the term of this patent is extended or adjusted under 35 U.S.C. 154(b) by 171 days.

(21) Appl. No.: 13/701,291

(22) PCT Filed: Jun. 1, 2011

(86) PCT No.: PCT/FR2011/000323
§ 371 (c)(1),
(2), (4) Date: Feb. 15, 2013

(87) PCT Pub. No.: WO2011/151540
PCT Pub. Date: Dec. 8, 2011

(65) Prior Publication Data
US 2013/0153779 A1   Jun. 20, 2013

(30) Foreign Application Priority Data
Jun. 3, 2010  (FR) ...................................... 10 02353

(51) Int. Cl.
| G21K 5/04 | (2006.01) |
| H01J 37/32 | (2006.01) |
| H01J 37/244 | (2006.01) |
| G01T 1/02 | (2006.01) |

(52) U.S. Cl.
CPC ............ *G01T 1/02* (2013.01); *H01J 37/32412* (2013.01); *H01J 37/244* (2013.01);
(Continued)

(58) Field of Classification Search
USPC .......... 250/396 R, 397, 492.1, 492.2, 492.21, 250/492.22, 492.3
See application file for complete search history.

(56) References Cited

U.S. PATENT DOCUMENTS

| 5,319,212 A | 6/1994 | Tokoro |
| 6,050,218 A * | 4/2000 | Chen et al. ................ 118/723 E |
| 2001/0042827 A1* | 11/2001 | Fang et al. .................... 250/283 |
| 2009/0242791 A1 | 10/2009 | Chen et al. |

FOREIGN PATENT DOCUMENTS

WO    2010/075283 A2    7/2010

OTHER PUBLICATIONS

K. Nakamura et al, "Development of a new technique for high-energy secondary-electron measurements in plasma immersion ion implantation", Plasma Sources Science and Technology, Insititute of Physics Publishing, Bristol, GB, vol. 6, No. 1, Feb. 1, 1997, pp. 86-90, XP020070209.

(Continued)

*Primary Examiner* — Nicole Ippolito
(74) *Attorney, Agent, or Firm* — Sughrue Mion, PLLC

(57) ABSTRACT

The present invention relates to a dose-measurement device for ion implantation, the device comprising a module CUR for estimating implantation current, a secondary electron detector DSE, and a control circuit CC for estimating the ion current by taking the difference between said implantation current and the current from said secondary electron detector. Furthermore, said high-energy secondary electron detector comprises a collector COL, P supporting exactly three mutually insulated electrodes:
 a first repulsion electrode G1, A1, T1 for repelling charges of a predetermined sign that are to be repelled, said electrode being provided with at least one orifice for passing electrons;
 a second repulsion electrode G2, A2, T2 for repelling charges of the opposite sign that are to be repelled, said electrode also being provided with at least one orifice for passing electrons; and
 a selection electrode G3, A3, T3, this electrode also being provided with at least one orifice for passing electrons.

13 Claims, 2 Drawing Sheets

(52) U.S. Cl.
CPC *H01J 37/32935* (2013.01); *H01J 2237/31703* (2013.01); *H01J 37/32422* (2013.01); *H01J 2237/24405* (2013.01); *H01J 2237/2448* (2013.01)
USPC .................. 250/492.3; 250/492.1; 250/492.2; 250/396 R; 250/397

(56) References Cited

OTHER PUBLICATIONS

D. Gahan et al, Comparison of plasma parameters determined with a Langmuir probe and with a retarding field energy analyzer; RFEA and Langmuir probe comparison:, Plasma Sources Science and Technology, Institute of Physics Publishing, Bristol, GB, vol. 17, No. 3, Aug. 1, 2008, p. 35026 (pp. 1-9) XP020145160.

K. Nakamura et al, "Direct measurements of sheath-accelerated secondary electrons for monitoring the incident ion flux in plasma immersion ion implantation; Sheath-accelerated secondary electrons", Plasma Sources Science and Technology, Institute of Physics Publishing, Bristol, GB, vol. 11, No. 2, May 2, 2002, pp. 161-164, XP020069938.

M. Dreval et al, "Retarding field energy analyzer for the Saskatchewan Torus-Modified plasma boundary", Review of Scientific Instruments, AIP, Melville, NY, US, vol. 80, No. 10, Oct. 22, 2009, pp. 103505-103505, XP012127922.

International Search Report for PCT/FR2011/000323.

* cited by examiner

DOSE MEASUREMENT DEVICE FOR PLASMA-IMMERSION ION IMPLANTATION

The present invention relates to a dose-measurement device for ion implantation in plasma immersion mode.

The field of the invention is that of ion implanters operating in plasma immersion mode. Thus, implanting ions in a substrate consists in immersing the substrate in a plasma and in biasing it with a negative voltage of a few tens of volts to a few tens of kilovolts (generally less than 100 kV), so as to create an electric field capable of accelerating the ions of the plasma towards the substrate so that they become implanted therein. The atoms implanted in this way are referred to as "dopants".

The penetration depth of the ions is determined by their acceleration energy. It depends firstly on the voltage applied to the substrate and secondly on the respective natures of the ions and of the substrate. The concentration of implanted atoms depends on the dose, which is expressed as a number of ions per square centimeter (ions/cm$^2$), and on the implantation depth.

One of the essential parameters during implantation is the dose of dopants that have been implanted. This dose needs to be known accurately. It is obtained by integrating the positive charges that reach the substrate.

Thus, document U.S. Pat. No. 6,050,218 describes a charge collector for estimating the implantation dose in plasma immersion. The collector placed under the substrate is a Faraday cage that collects a fraction of the ions of the plasma. The implantation current is deduced therefrom. Only positive ions are taken into account.

Documents WO 01/41183 and WO 00/08670 relate likewise to dose measurement in ion implantation. Once more a Faraday cage type collector is used to recover a fraction of the positive ions. That collector is adjacent to the substrate.

Document WO 2005/104175 proposes limiting the bias of the estimate by arranging a plurality of collectors on different radii relative to the center of the substrate. The estimate is improved since the measurement takes place all around the substrate. Nevertheless, it does not take account of the radial non-uniformities of the plasma, and these are considerable.

It should nevertheless be observed that the positive charges are not due solely to the positive ions that reach the substrate, but that they also come from the generation of secondary electrons that are released from the surface of the substrate.

On ion beam implanters, secondary electrons have little energy, such that they can be taken towards the substrate by means of a Faraday cage surrounding it, the cage being optically closed by a negative potential barrier.

In an implanter operating in plasma immersion mode, the secondary electrons are accelerated with energy that is substantially identical to the energy of the positive ions of the plasma, which makes it much more difficult to bring them back towards the substrate.

Thus, document U.S. Pat. No. 5,319,212 teaches a dose-measurement device comprising a module for estimating the implantation current, and also comprising a secondary electron detector and further comprising a control circuit for estimating the ion current by taking the difference between the implantation current and the current from the secondary electron detector.

The secondary electron detector is suitable for measuring only slow electrons having maximum energy that is determined by a power supply voltage that is necessarily low. If this were not so, the plasma would be disturbed.

Document WO 2010/075283 also discloses a dose-measurement device comprising a module for estimating implantation current and also including a secondary electron detector and further including a control circuit for estimating the ion current by taking the difference between the implantation current and the current from the secondary electron detector.

The above remark relating to the secondary electron detector applies likewise.

In the two above documents, the detector is not very effective in eliminating slow electrons or ions coming from the plasma. If the power supply voltage of the detector is adjusted so as to block the electrons from the plasma, some of the ions are likely to be taken into account, and vice versa. It would be appropriate for the secondary electron detector to count only fast electrons.

The invention proposes providing an improvement to that situation.

According to the invention, a dose-measurement device for ion implantation comprises a module for estimating implantation current, a secondary electron detector, and a control circuit for estimating the ion current by taking the difference between said implantation current and the current from said secondary electron detector; furthermore, the high-energy secondary electron detector comprises a collector supporting exactly three mutually insulated electrodes:

a first repulsion electrode for repelling charges of a predetermined sign that are to be repelled, said electrode being provided with at least one orifice for passing electrons;

a second repulsion electrode for repelling charges of the opposite sign that are to be repelled, said electrode also being provided with at least one orifice for passing electrons; and a selection electrode, this electrode also being provided with at least one orifice for passing electrons.

In a preferred embodiment of the invention, the orifices in said electrodes are in alignment on a conduction cylinder that forms an opening of said electron detector.

Furthermore, said collector is in the form of a cup.

According to an additional characteristic of the invention, said electrodes are made of aluminum.

Preferably, the spacing between two consecutive electrodes lies in the range 6 millimeters (mm) to 10 mm.

Ideally, the openings in said electrodes present area lying in the range 15 square millimeters (mm$^2$) to 30 mm$^2$.

In a first embodiment of the secondary electron detector, said electrodes are constituted by grids.

Advantageously, the transparency of said grids is greater than 50%.

It is also desirable, when the distance between two consecutive grids is written h and the diameter of the orifices in said grids is written D, for the ratio written h/D to be greater than 1.

In a second embodiment of the secondary electron detector, the electrodes are constituted by rings.

Likewise, when the distance between two consecutive rings is written h and the diameter of said conduction cylinder is written D, the ratio written h/D is greater than 1.

The measurement is further improved if the device also includes a spectrometer for estimating the proportion of a predetermined species of ion, said control circuit including means for applying said proportion to said ion current.

It may also be desirable to provide at least one additional secondary electron detector.

The present invention appears below in greater detail in the context of the following description of embodiments given by way of illustration and with reference to the accompanying figures, in which:

FIG. 3 is a diagrammatic section view of a second embodiment of a detector, and more particularly:

Elements shown in more than one of the figures are given the same references in each of them.

Figure 1:
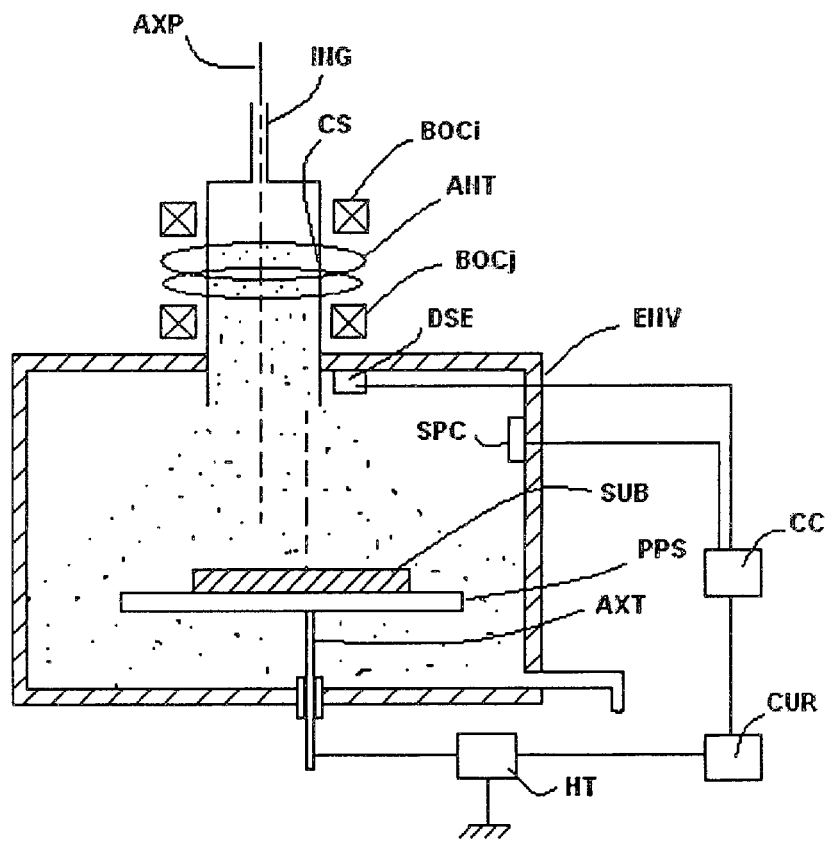
FIG. 1 shows an implanter in diagrammatic vertical section.

As shown in FIG. 1, an ion implanter comprises a plurality of elements arranged inside and outside a vacuum enclosure ENV. For microelectronics applications, it is recommended to use an enclosure made of aluminum alloy if it is desired to limit contamination by metallic elements such as iron, chromium, nickel, or cobalt. It is also possible to use a coating of silicon or of silicon carbide.

A substrate carrier platen PPS, is in the form of a disk in a horizontal plane that is rotatable about its vertical axis AXT, and it receives the substrate SUB that is to be subjected to ion implantation. It is connected to a high voltage electrical power supply HT that is also connected to ground.

The top portion of the enclosure ENV receives the source body CS, that is cylindrical and on the vertical axis AXP. This body is made of quartz. It is surrounded externally, firstly by confinement coils BOCi and BOCj, and secondly by an external radio-frequency antenna ANT. The inlet ING for the plasma-generating gas is coaxial with the vertical axis AXP of the source body CS. This vertical axis AXP meets the surface of the substrate carrier platen PPS on which the substrate SUB for implanting is placed.

It is possible to use any type of pulsed plasma source: discharge, inductively coupled plasma (ICP), helicon, microwave, arc. These sources need to operate at pressure levels that are low enough to ensure that the electric field created between the platen PPS at high voltage and the enclosure ENV at ground potential does not ignite a discharge plasma that would disturb the pulsed operation of the source.

More precisely, the dose-measurement device comprises a module for estimating the implantation current CUR that acts as an ammeter connected between the substrate carrier PPS and ground. The implantation current may also be delivered directly by the high voltage power supply HT that biases the substrate SUB.

The device also includes a secondary electron detector DSE and it also has a control circuit CC for estimating the density per unit area of the ion current by taking the difference between the density per unit area of the implantation current and the density per unit area of the current from the secondary electron detector.

The secondary electron detector DSE is arranged facing the substrate SUB.

Measurement of the dose of a given species of ion can be significantly improved by using a spectrometer SPC, e.g. a mass spectrometer or an optical spectrometer, within the enclosure ENV. The spectrometer identifies the proportion of that species in the plasma and provides the proportion to the control circuit CC which takes it into account. By way of example, the dose is estimated by multiplying the ion current by that proportion.

The device is further improved if a plurality of secondary electron detectors are provided that are arranged above the substrate. It is thus possible to monitor the uniformity of implantation.

Figure 2:
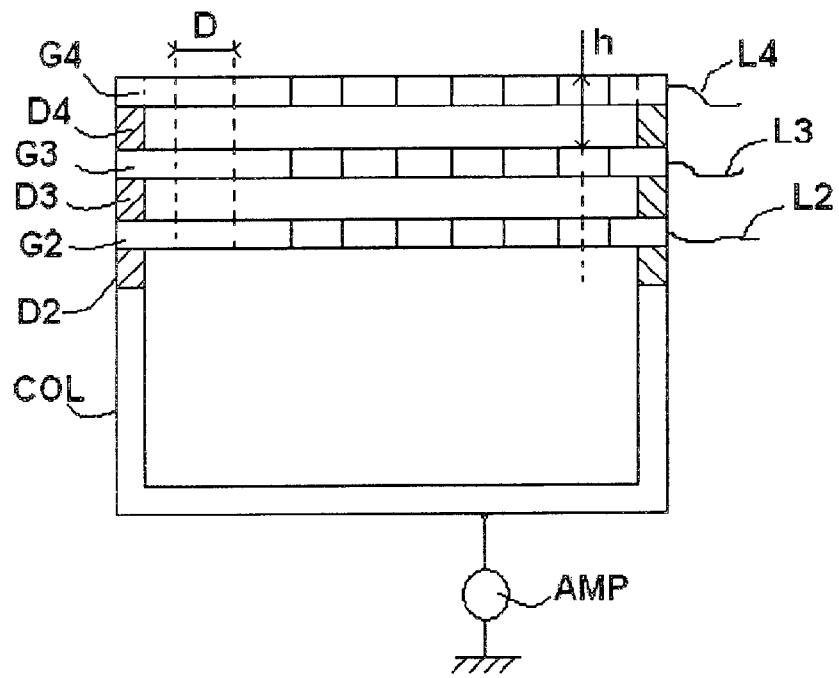
FIG. 2 is a diagrammatic section view of a first embodiment of a detector of the invention.

With reference to FIG. 2, in a first embodiment, the detector DSE comprises a collector COL in the form of a cup or a bell. The collector COL is connected to ground via an ammeter AMP that measures the secondary electron current.

The collector COL is surmounted by a first insulator D1, itself surmounted by a first electrically-conductive grid G1.

The first grid G1 is surmounted by a second insulator D2, itself surmounted by a second electrically-conductive grid G2.

The second grid G2 is surmounted by a third insulator D3, itself surmounted by a third electrically-conductive grid G3.

The spacing between the grids G1-G2 and G2-G3 preferably lies in the range 6 mm to 10 mm. It is typically 8 mm.

It is recalled that transparency is defined as the ratio of the area of the openings in the grid to the total area of the grid. In the present example, the transparency of the grid must be very high, preferably greater than 50%.

These openings must also present area that is relatively large so that they do not capture the charged species that need to reach the collector. Advantageously, this area lies in the range 15 $mm^2$ to 30 $mm^2$. By way of example, a circular opening may present a diameter of the order of 5 mm.

The detector needs to fulfill the following functions:
  recover the high-energy secondary electrons on the collector COL;
  recover the low-energy secondary electrons on the collector when they are the result of impacts of the high-energy electrons; and
  repel the low-energy electrons and ions of the plasma.

It is also appropriate to avoid creating a plasma or an arc within the detector as a result of the bias voltages applied to the grids G1, G2, and G3. For this purpose, reference may be made to Paschen's law. The detector must not add species that would contaminate the plasma. For applications in the field of microelectronics, it is advantageous to select aluminum for the conductors and alumina for the insulators.

It is also necessary to avoid disturbing the plasma generated within the ion implanter.

The first grid G1 is biased by means of a first cable L1 to a negative voltage of less than 120 volts, typically 100 volts, relative to the collector COL.

The second grid G2 is biased by means of a second cable L2 to a positive voltage of less than 120 volts, typically 100 volts, relative to the collector COL.

The third grid G3 is biased by means of a third cable L3 to a negative voltage of less than 60 volts, typically 50 volts, relative to the collector COL.

In this first embodiment, the detector has a plurality of openings, each of these openings corresponding to three orifices in alignment through the grids.

Thus, these openings are each in alignment on a conduction cylinder of diameter D.

Writing the diameter of these openings as D and the distance between two grids as h, the ratio written h/D has a magnitude of about 1.5, and is in any event preferably greater than 1.

In a second embodiment, the detector no longer presents a plurality of openings but presents a tubular structure having a single opening.

Figures 3A, 3B:
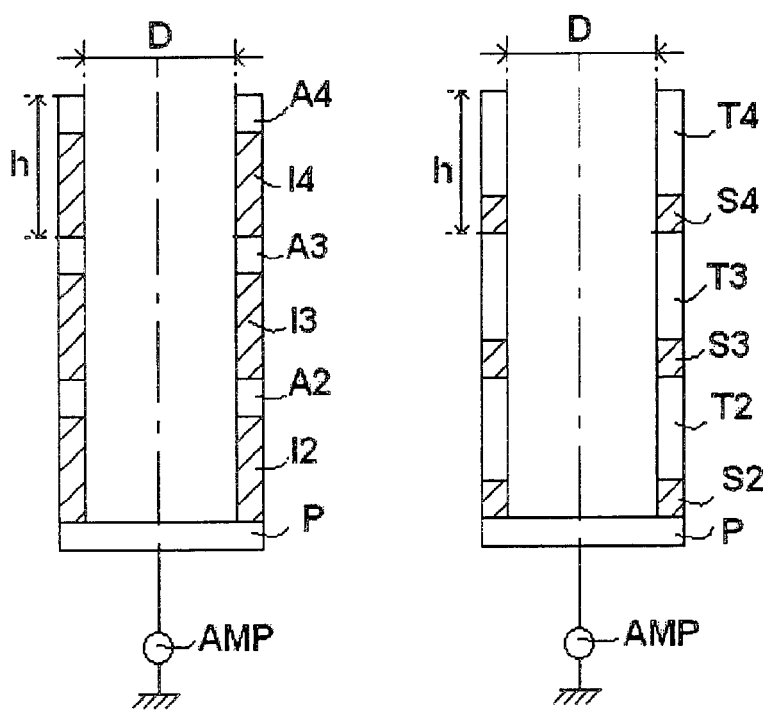
FIG. 3a shows a first variant of the second embodiment.
FIG. 3b shows a second variant of the second embodiment.

With reference to FIG. 3a, in a first variant, the collector P is in the form of a plate. The collector is surmounted by a first insulating ring I1, which is itself surmounted by a first conductive ring A1. The inside diameter of these two rings is D. The thickness of the first insulating ring I1 is substantially greater than the thickness of the first conductive ring A1 and the sum of these two thicknesses is h.

The first conductive ring A1 is surmounted by a second insulating ring I2, itself surmounted by a second conductive ring A2.

These second rings I2 and A2 have the same shape as the first rings I1 and A1.

The second conductive ring A2 is surmounted by a third insulating ring 13, itself surmounted by a third conductive ring A3. These third rings 13 and A3 are likewise of the same shape as the first rings I1 and A1.

The collector P is likewise connected to ground via an ammeter AMP.

The shape is the same as the shape of the openings in the first embodiment. Thus, the ratio h/D is preferably greater than 1.

The first, second, and third conductive rings A1, A2, and A3 are biased like the first, second, and third grids G1, G2, and G3 respectively in the first embodiment.

With reference to FIG. 3b, in a second variant, the collector P is likewise in the form of a plate. The collector is surmounted by a first insulating ring S1 itself surmounted by a first conductive ring T1. The inside diameter of these two rings is once more D. In contrast, the thickness of the first insulating ring S1 is considerably smaller than the thickness of the first conductive ring T1, and the sum of these two thicknesses is still h.

The first conductive ring T1 is surmounted by a second insulating ring S2, itself surmounted by a second conductive ring T2.

These second rings S2, T2 have the same shape as the first rings S1, T1.

Likewise, the second conductive ring T2 is surmounted by a third insulating ring S3, itself surmounted by a third conductive ring T3. These third rings S3, T3 are likewise of the same shape as the first rings S1, T1.

Once more, the shape reproduces that of the openings in the first embodiment. Thus, the ratio h/D is preferably greater than 1.

In this second variant, the rings are analogous to the rings of the first variant, but the thicknesses of the insulating elements and the conductive elements are interchanged.

The above-described embodiments of the invention have been selected because of their concrete natures. Nevertheless, it is not possible to list exhaustively all embodiments covered by the invention. In particular, any of the means described may be replaced by equivalent means without going beyond the ambit of the present invention.

The invention claimed is:

1. A dose-measurement device for ion implantation, the device comprising a module (CUR) for estimating implantation current, a secondary electron detector (DSE), and a control circuit (CC) for estimating the ion current by taking the difference between said implantation current and the current from said secondary electron detector, the device being characterized in that said high-energy secondary electron detector comprises a collector (COL, P) supporting exactly three mutually insulated electrodes:
   a first repulsion electrode (G1, A1, T1) for repelling charges of a predetermined sign that are to be repelled, said electrode being provided with at least one orifice for passing electrons;
   a second repulsion electrode (G2, A2, T2) for repelling charges of the opposite sign that are to be repelled, said electrode also being provided with at least one orifice for passing electrons; and
   a selection electrode (G3, A3, T3), this electrode also being provided with at least one orifice for passing electrons.

2. A device according to claim 1, characterized in that the orifices in said electrodes are in alignment on a conduction cylinder (D) that forms an opening of said electron detector (DSE).

3. A device according to claim 1, characterized in that said collector (COL) is in the form of a cup.

4. A device according to claim 1, characterized in that said electrodes (G1-A1-T1, G2-A2-T2, G3-A3-T3) are made of aluminum.

5. A device according to claim 1, characterized in that the spacing between two consecutive electrodes (G1-G2, G2-G3) lies in the range 6 mm to 10 mm.

6. A device according to claim 1, characterized in that the openings in said electrodes (G1-A1-T1, G2-A2-T2, G3-A3-T3) present an area lying in the range 15 mm$^2$ to 30 mm$^2$.

7. A device according to claim 1, characterized in that said electrodes are constituted by grids (G1, G2, G3).

8. A device according to claim 7, characterized in that the transparency of said grids (G1, G2, G3) is greater than 50%.

9. A device according to claim 7, characterized in that the distance between two consecutive grids is written h, the diameter of the orifices in said grids is written D, and the ratio written h/D is greater than 1.

10. A device according to claim 1, characterized in that said electrodes are constituted by rings (A1-T1, A2-T2, A3-T3).

11. A device according to claim 10, characterized in that the distance between two consecutive rings is written h, the diameter of said conduction cylinder is written D, and the ratio written h/D is greater than 1.

12. A device according to claim 1, characterized in that it also includes a spectrometer (SPC) for estimating the proportion of a predetermined species of ion, said control circuit (CC) including means for applying said proportion to said ion current.

13. A device according to claim 1, characterized in that it includes at least one additional secondary electron detector.

* * * * *